US011894254B2

(12) United States Patent
Launay

(10) Patent No.: US 11,894,254 B2
(45) Date of Patent: Feb. 6, 2024

(54) SUPPORT

(71) Applicant: SPTS TECHNOLOGIES LIMITED, Newport (GB)

(72) Inventor: Nicolas Launay, Newport (GB)

(73) Assignee: SPTS TECHNOLOGIES LIMITED, Newport (GB)

(*) Notice: Subject to any disclaimer, the term of this patent is extended or adjusted under 35 U.S.C. 154(b) by 0 days.

(21) Appl. No.: 16/567,865

(22) Filed: Sep. 11, 2019

(65) Prior Publication Data
US 2020/0090973 A1 Mar. 19, 2020

(30) Foreign Application Priority Data
Sep. 19, 2018 (GB) ...................................... 1815258

(51) Int. Cl.
*H01L 21/683* (2006.01)
*H01J 37/32* (2006.01)
*H01L 21/67* (2006.01)
*H01L 21/3065* (2006.01)

(52) U.S. Cl.
CPC .... *H01L 21/6833* (2013.01); *H01J 37/32724* (2013.01); *H01L 21/3065* (2013.01); *H01L 21/67069* (2013.01); *H01L 21/67103* (2013.01); *H01J 2237/002* (2013.01); *H01J 2237/007* (2013.01); *H01J 2237/334* (2013.01)

(58) Field of Classification Search
CPC ........... H01L 21/6833; H01L 21/67103; H01L 21/67069; H01L 21/3065; H01J 37/32724; H01J 2237/002; H01J 2237/007; H01J 2237/334

USPC ....... 156/345.3, 345.1–345.55; 118/715–733
See application file for complete search history.

(56) References Cited

U.S. PATENT DOCUMENTS

| | | | | |
|---|---|---|---|---|
| 5,589,003 | A * | 12/1996 | Zhao ................... | C23C 16/4585 118/500 |
| 5,805,408 | A | 9/1998 | Maraschin et al. | |
| 5,810,936 | A * | 9/1998 | Leung ............... | H01L 21/67028 118/500 |
| 5,886,863 | A * | 3/1999 | Nagasaki ............... | H02N 13/00 279/128 |
| 6,195,246 | B1 * | 2/2001 | Livesay .............. | H01L 21/6831 361/234 |

(Continued)

FOREIGN PATENT DOCUMENTS

| | | |
|---|---|---|
| CN | 101563770 A | 10/2009 |
| CN | 104616957 A | 5/2015 |

(Continued)

OTHER PUBLICATIONS

EPO, ESR for EP19196355, dated Feb. 6, 2020.
(Continued)

*Primary Examiner* — Charlee J. C. Bennett
(74) *Attorney, Agent, or Firm* — Hodgson Russ LLP

(57) ABSTRACT

A substrate support includes an electrostatic chuck having an upper surface, and a cover positioned on the electrostatic chuck to cover the upper surface thereof. The cover includes a first face adjacent the upper surface of the electrostatic chuck, a second face for supporting a substrate, and one or more conduits extending through the cover to permit a cooling gas to flow from the second face to the first face. The cover is made from a dielectric material.

18 Claims, 4 Drawing Sheets

(56) References Cited

U.S. PATENT DOCUMENTS

| | | | |
|---|---|---|---|
| 6,259,592 B1* | 7/2001 | Ono | H01L 21/6831 |
| | | | 279/128 |
| 2006/0108231 A1* | 5/2006 | Weichart | C23C 16/4585 |
| | | | 205/165 |
| 2009/0310274 A1* | 12/2009 | Koyama | H01L 21/6833 |
| | | | 361/234 |
| 2012/0264051 A1* | 10/2012 | Angelov | H01L 21/67161 |
| | | | 156/345.52 |
| 2012/0320491 A1 | 12/2012 | Doh | |
| 2015/0036259 A1 | 2/2015 | Cox et al. | |
| 2015/0049410 A1 | 2/2015 | Ono | |
| 2015/0126038 A1* | 5/2015 | Okita | H01L 21/6831 |
| | | | 438/715 |
| 2016/0111314 A1 | 4/2016 | Kimball et al. | |
| 2018/0044784 A1 | 2/2018 | Boughton et al. | |
| 2018/0122633 A1* | 5/2018 | Leeser | H01L 21/6833 |

FOREIGN PATENT DOCUMENTS

| | | | |
|---|---|---|---|
| JP | 2003168725 A | | 6/2003 |
| KR | 20080088961 A | * | 10/2008 |
| KR | 20080088961 A | | 10/2008 |
| TW | 200834801 A | | 8/2008 |
| TW | 201104750 A | | 2/2011 |
| WO | 2008088471 A1 | | 7/2008 |

OTHER PUBLICATIONS

EPO, Communication from the Examining Division for EP Application No. 19196355.2, dated Mar. 28, 2022.

CNIPA, Office Action for CN Application No. 201910882394.0, dated Aug. 2, 2023 (ee X/Y/A designations on p. 6).

TIPO, Office Action for TW Application No. 108133617, dated Sep. 15, 2023.

* cited by examiner

SUPPORT

BACKGROUND

This invention relates to a support for supporting a substrate, in particular, a substrate support for supporting a semiconductor substrate for use in a plasma processing apparatus. This invention also relates to associated plasma processing apparatus and methods of supporting a substrate.

Electrostatic chucks (ESCs) are often used for clamping a substrate in position during microelectronic fabrication processes. For example, an ESC may be used in plasma etching and deposition processes to electrostatically clamp a semiconductor substrate to the ESC. ESCs are also typically used to help regulate substrate temperature in such processes. For example, the substrate is typically heated by the plasma during plasma processing. Additionally, there may be a process requirement for an RF bias to be capacitively coupled to the substrate, which may further contribute to substrate heat load. The ESC regulates the substrate temperature by electrostatically clamping the substrate to the cooled ESC so that heat can be transferred away from the substrate. It is apparent that the ESC is often a critical and expensive component in a plasma processing apparatus.

However, surfaces of the ESC that are exposed to the processing conditions may erode over time, for example by sputtering or ion bombardment. Additionally, substrate breakage and/or contamination of the ESC surface, for example by thin film deposition, can also contribute to the degradation of the ESC. These factors can result in costly ESC replacement and tool downtime.

FIG. 1 shows a known substrate support 2 comprising an electrostatic chuck (ESC) 4 attached to a platen 5. An annular cover 6 protects an otherwise exposed edge region of the ESC 4. A substrate 7 is positioned on the ESC 4. In this example, an annular focus ring 8 is employed to control plasma uniformity during substrate processing. When such a substrate support 2 is used in a plasma processing apparatus, e.g. a plasma etching tool, particulate deposits 9 may be formed on the annular cover 6. The accumulation of particulate deposits 9, such as polymer deposits, can lead to contamination problems.

FIG. 2 shows a plan view of an ESC 10 where polymer deposits 12 have accumulated on an annular cover 16 through use. Lift pins 14 are also shown. The particulate deposits 12 can contaminate subsequent processing steps. It is desirable to avoid the accumulation of these deposits on the annular cover 16 or ESC 10.

SUMMARY

The present invention, in at least some of its embodiments, seeks to address at least some of the above described problems, desires and needs. In particular, the present invention, in at least some of its embodiments, provides one or more of: an improved ESC lifetime, reduced erosion of the ESC; and/or a reduced accumulation of particulate deposits. This can be achieved whilst maintaining efficient and effective ESC functionality and clamping. That is, whilst the ESC provides effective thermal regulation of the substrate and a sufficient clamping force on the substrate to fix the substrate in position on the support.

According to a first aspect of the invention there is provided a substrate support comprising:
an electrostatic chuck (ESC) comprising an upper surface;
a cover positioned on the electrostatic chuck to cover the upper surface thereof, the cover comprising a first face adjacent the upper surface of the electrostatic chuck, a second face for supporting a substrate, and one or more conduits extending through the cover to permit a cooling gas to flow from the second face to the first face; wherein the cover is made from a dielectric material.

According to a second aspect of the invention there is a plasma processing apparatus comprising:
a chamber; and
the substrate support according to the first aspect of the invention disposed within the chamber.

According to a third aspect of the invention there is provided a plasma processing apparatus according to the second aspect of the invention in combination with a substrate positioned on the second face of the cover.

According to a fourth aspect of the invention there is a method of processing a substrate using the substrate support of the first aspect of the invention, the method comprising the steps of:
providing an electrostatic chuck comprising an upper surface;
positioning a cover on the electrostatic chuck to cover the upper surface thereof, the cover comprising a first face adjacent the upper surface of the electrostatic chuck, a second face for supporting the substrate, and one or more conduits extending through the cover to permit a cooling gas to flow from the first face to the second face;
positioning the substrate on the second face of the cover;
operating the electrostatic chuck to electrostatically clamp the substrate in position, wherein the substrate is electrostatically coupled to the electrostatic chuck through the cover;
flowing a cooling gas from the first face to the second face via the one or more conduits to cool the substrate; and
processing the substrate.

The method steps may be performed in any suitable order. For example, the step of flowing the cooling gas may be performed before, after, or simultaneously with the step of processing the substrate.

The cover overlays the upper surface of the ESC to protect the upper surface from being exposed to harsh processing conditions, for example, during plasma processing such as plasma etching or deposition. This prevents erosion of the electrostatic chuck and therefore significantly increases the lifetime of the electrostatic chuck. Instead, the cover is designed to be a relatively inexpensive consumable part. The cover is exposed to processing conditions during plasma processing and may be eroded over time.

After the step of processing the substrate, the method of the fourth aspect can further comprise replacing the cover with a second cover according to the first aspect. The method steps can be repeated to process a second substrate, wherein the second cover replaces the first cover. For example, the method can further comprise positioning the second cover on the electrostatic chuck to cover the upper surface thereof. The second cover can comprise a first face adjacent the upper surface of the electrostatic chuck, a second face for supporting the second substrate, and one or more conduits extending through the second cover to permit a cooling gas to flow from the first face to the second face. The method can comprise positioning the second substrate on the second face of the second cover. The method can comprise operating the electrostatic chuck to electrostatically clamp the second substrate in position, wherein the second substrate is electrostatically coupled to the electrostatic chuck through the second cover. The method can comprise flowing a cooling gas from the first face to the second face of the second cover via the one or more conduits to cool the second substrate. The method can comprise processing the second substrate.

The electrostatic chuck may be operable to provide an electrostatic clamping force that clamps the substrate to the substrate support through the cover. The electrostatic chuck electrostatically couples to the substrate through the cover. The electrostatic clamping force acting on the substrate acts to clamp the cover to the electrostatic chuck. Preferably, the cover is not otherwise clamped to the electrostatic chuck, either electrostatically or mechanically. It is counter-intuitive and not straightforward to use a cover between a substrate and the ESC. A cover would be expected to reduce the thermal conductivity between the ESC and a substrate being processed. Similarly, such a cover would be expected to reducing the clamping effect of the substrate on the ESC. However, the present inventors have found that a cover which comprises one or more conduits and has an appropriate thickness can provide adequate thermal regulation and clamping of the substrate.

The cover may have a thickness of 100-1500 µm, preferably 300-1000 µm. A thicker cover provides a consumable part with a longer lifetime. However, a thicker cover attenuates the electrostatic coupling between the substrate and the electrostatic chuck to a greater extent thereby reducing the clamping force felt by the substrate. If the clamping force is too weak, the substrate may be partially lifted or displaced when subjected to a backside cooling gas. Preferably, the substrate remains clamped to the support when a backside cooling gas of at least 25 Torr is applied. In contrast, a thinner cover has a shorter lifetime but allows greater electrostatic coupling between the electrostatic chuck and the substrate.

The second face of the cover may be planar. The cover may be a disc or disc-like. Disc or disc-like is used here to mean a substrate having a substantially flat, circular shape or appearance. A planar second face of the cover helps to provide a high surface area contact between the cover and the substrate. This ensures a good thermal contact between the cover and the substrate, which can enhance substrate cooling. Optionally, the second face of the cover may comprise channels or grooves to improve gas conductance across the second face.

The second face may comprise a substrate support region and a peripheral region radially outward of the substrate support region, so that when a substrate is being supported the substrate overlays the substrate support region. The peripheral region may remain uncovered. The substrate support region and the peripheral region may be coplanar.

Preferably, the cover has a diameter that is larger than the diameter of the substrate being supported. The substrate support region of the cover corresponds to the region of the cover that directly supports the substrate. Providing a cover that extends beyond the diameter of the substrate helps to reduce the accumulation of particulate deposits on the substrate support. In particular, having a peripheral region that is exposed during processing allows ion bombardment to occur on the exposed region. Without being bound by any theory or conjecture, it is believed that, during plasma processing, ions from the plasma bombard the exposed peripheral region of the cover so that particulate deposits or contaminants are removed from the peripheral region. This helps to prevent, or at least reduce, the accumulation of contaminants on the substrate support.

The one or more conduits may be disposed in the substrate support region. Typically, the conduits supply a cooling gas to the underside of the substrate being supported. The cooling gas can provide efficient cooling for the substrate. Preferably, the conduits are arranged so that a substantially uniform flow of cooling gas is supplied to the underside of the substrate being supported.

The upper surface of the electrostatic chuck may comprise a clamping region for providing an electrostatic clamping force. The electrostatic clamping force may be provided by a suitable electrode structure contained within the body of the electrostatic chuck which underlies the clamping region. The upper surface of the electrostatic chuck may further comprise an edge region extending radially outwardly of the clamping region. The clamping force may be an electrostatic clamping force. The upper surface of the electrostatic chuck may be planar. The clamping region may be coplanar with the edge region.

The clamping region may have a diameter larger than the diameter of the substrate support region. The clamping region may extend beyond the diameter of the substrate being supported. This enhances the electrostatic coupling between the substrate and the electrostatic chuck. The substrate may be electrostatically coupled to the electrostatic chuck across its full diameter.

The cover and the electrostatic chuck may each have a diameter, and the diameter of the cover is equal to or larger than the diameter of the electrostatic chuck. Preferably, the cover fully covers the upper surface of the electrostatic chuck. The peripheral region of the cover may extend beyond the edge region of the electrostatic chuck. The cover provides a protective barrier over the electrostatic chuck. This protects the upper surface of the electrostatic chuck from harsh processing environments, and can help to increase the lifetime of the electrostatic chuck.

The cover may be made from dielectric materials such as $Al_2O_3$ or AlN. Both $Al_2O_3$ and AlN may be machined easily and are well suited for this application. AlN provides improved thermal conductivity compared to $Al_2O_3$ but at additional cost.

The cover may be replaceable by virtue of not being attached to the electrostatic chuck other than through electrostatic clamping of the substrate caused by the operation of the electrostatic chuck. The replaceable cover may be a consumable part. The cover can be devoid of electrodes.

The electrostatic chuck may further comprise one or more cooling channels for providing the cooling gas to the first face of the cover. The one or more cooling channels may provide a cooling gas for flowing through the one or more conduits in the cover.

The cooling gas may be helium. The cooling gas between the electrostatic chuck and the first face of the cover may be at least 10 Torr, preferably at least 25 Torr. A higher gas pressure can improve heat transfer away from the substrate.

The electrostatic chuck can comprise an upper dielectric plate. The upper surface of the electrostatic chuck can be the upper dielectric plate. The cover can be positioned on the upper dielectric plate. The cover can fully cover the upper dielectric plate of the electrostatic chuck. The diameter of the cover can be larger than the diameter of the upper dielectric plate.

The electrostatic chuck may further comprise at least one DC electrode supplied by a DC power supply. Typically, the DC power supply is a high voltage DC power supply. The electrostatic chuck may further comprise at least one RF electrode supplied by an RF bias. The DC electrode and/or the RF electrode may be a metal electrode. The DC electrode or electrodes may define the clamping region of the electrostatic chuck. The RF electrode or electrodes may extend beyond the substrate support region. The RF bias may have a frequency of about 380 kHz to about 13.56 MHz. The metal electrodes may be embedded in the electrostatic chuck between an upper dielectric plate and a lower dielectric plate. The upper surface of the electrostatic chuck may be made from a dielectric material. For example, the upper surface of the electrostatic chuck may be made from $Al_2O_3$ or AlN. The upper surface of the electrostatic chuck may be made from the same or a different dielectric material as the cover. The upper surface of the electrostatic chuck may be made from a material that has similar or the same thermal expansion properties as the cover. The upper dielectric plate may comprise the upper surface of the electrostatic chuck. The upper dielectric plate may have a thickness of about or less than the thickness of the cover. The upper dielectric plate may have a thickness of less than 3 mm, less than 2 mm, or less than 1 mm. The upper dielectric plate may have a thickness of 100-1500 μm, 200-1500 μm, or 300-1000 μm. The cover can protect the upper dielectric plate from harsh plasma processing conditions, when in use. Therefore, the thickness of the upper dielectric plate of the electrostatic chuck can be made thinner than upper dielectric plates of known electrostatic chucks without affecting the usable lifetime of the electrostatic chuck. A thinner upper dielectric plate can also provide an improved electrostatic clamping force.

The DC power supply may supply a voltage of more than about 1500 V, preferably more than about 2000 V, more preferably more than about 3000 V, and most preferably more than about 3500 V. The DC power supply may supply a voltage of about 2 kV. The DC power supply may supply a voltage of about 3.5 kV. The DC power supply may supply a voltage of about 5 kV.

The substrate support may further comprise a lifting assembly which in use is operable to separate a substrate from the cover. The lifting assembly may be operable to lift the substrate from the cover. That is, the lifting assembly may lift the substrate from the substrate support independently of the cover, so that when the substrate is lifted from the cover the cover remains in its position on the electrostatic chuck. The lifting assembly may comprise one or more lifting members, wherein the lifting assembly is operable to move the lifting members through corresponding apertures in the cover to separate the substrate from the cover. The lifting members may be lift pins. The lifting assembly may comprise a central lift pin and at least three arms extending from the central lift pin. This provides a stable lifting support for the substrate. The cover may comprise an aperture complementary in shape to the lifting assembly. A second lifting assembly may be operable to lift the cover from the upper surface of the electrostatic chuck.

The plasma processing apparatus may be a plasma etching apparatus. The plasma processing apparatus may further comprise a focus ring. The focus ring may help to improve the uniformity of the plasma in the chamber during processing. The focus ring may surround the edge of a substrate to be processed. The focus ring may surround the cover, substrate support region, and/or the peripheral region of the cover.

The substrate may be a semiconductor substrate. The substrate may be a silicon substrate. The substrate may be a wafer.

The second face of the cover may comprise a substrate support region and a peripheral region outward of the substrate support region so that the substrate overlays the substrate support region. The peripheral region may remain uncovered. The conduits may be disposed in the substrate support region.

Whilst the invention has been described above, it extends to any inventive combination of the features set out above, or in the following description, drawings or claims. For example, any features disclosed in relation to one aspect of the invention may be combined with any features of any of the other aspects of the invention.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Figure 1:
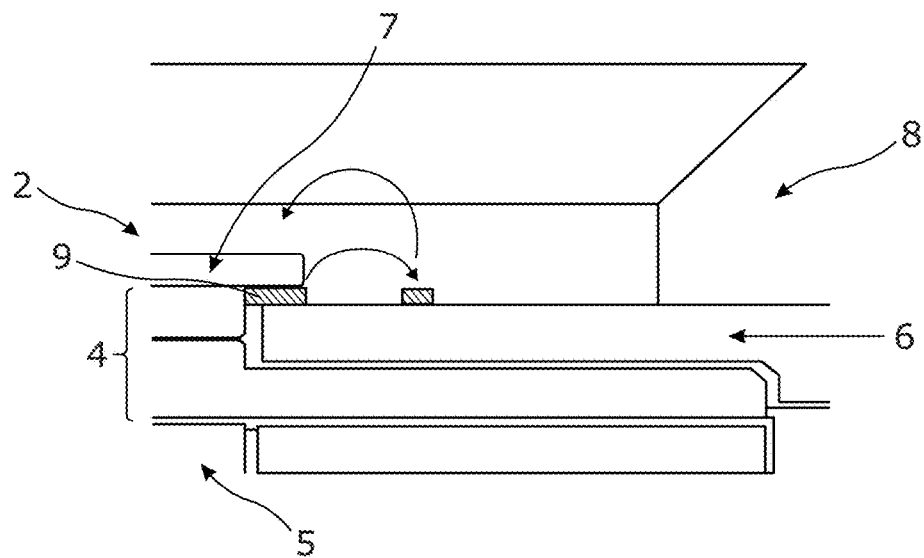
FIG. 1 is a cross-sectional view of a prior art substrate support.
Figure 2:
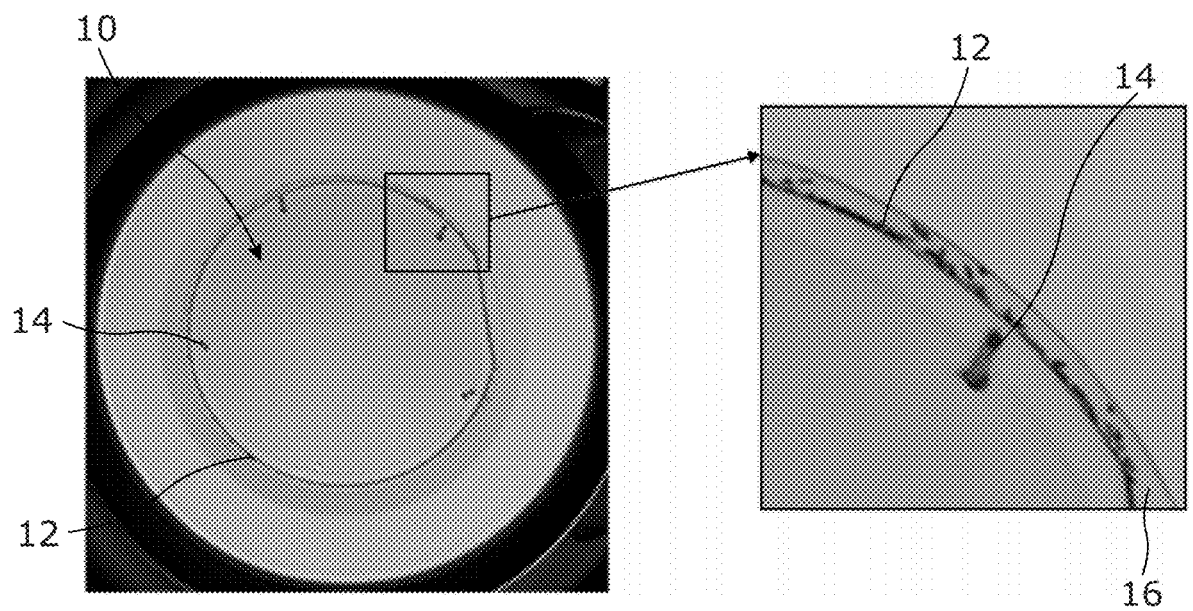
FIG. 2 is a plan view of a prior art flatted electrostatic chuck, where the inset shows a part of the electrostatic chuck at higher magnification.
Figure 3:
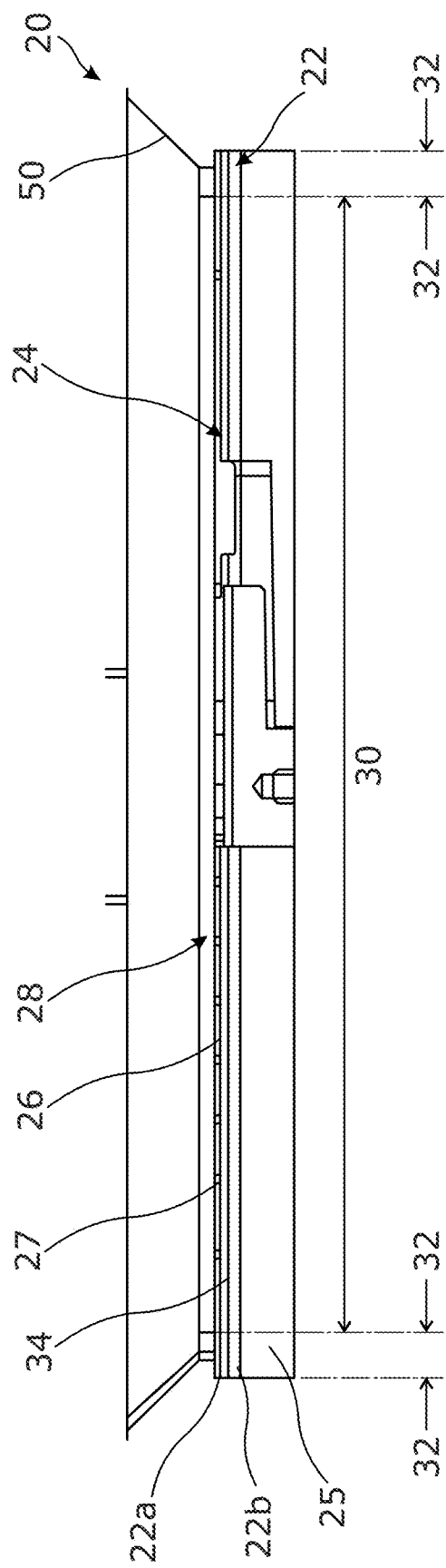
FIG. 3 is a cross-sectional view of a substrate support according to a first embodiment.
Figure 4:
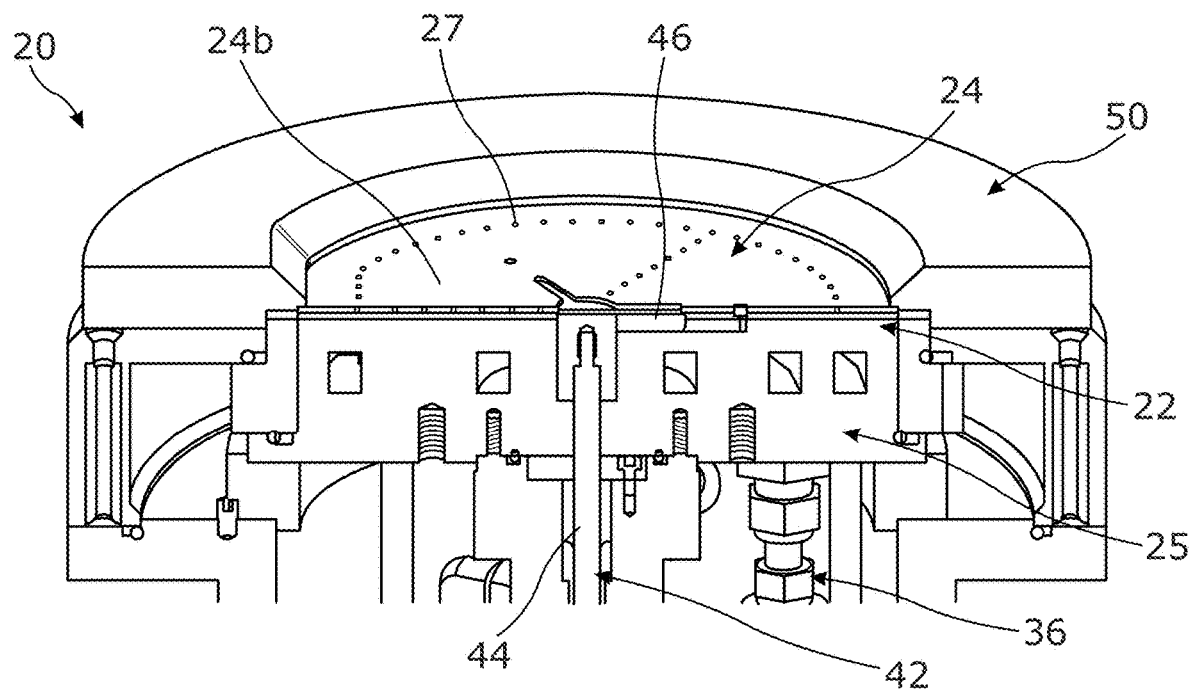
FIG. 4 is a cutaway perspective view of a substrate support according to the first embodiment.

FIGS. 3 and 4 show views of a substrate support, shown generally at 20, according to a first embodiment. For the avoidance of doubt, the same reference numerals have been used to refer to features that are identical. The substrate support 20 comprises an electrostatic chuck (ESC) 22 and a cover 24 positioned on the electrostatic chuck 22. The ESC 22 is typically attached to and supported by a platen 25. The platen 25 is typically a metallic body, made from aluminium or stainless steel. The cover 24 is typically made from a dielectric material or a ceramic material, such as $Al_2O_3$ or AlN. The cover 24 is detachable from the ESC 22 so that it can be replaced as necessary. The cover 24 overlays an upper surface 26 of the ESC 22. In the first embodiment, the cover 24 fully covers the upper surface 26 of the ESC 22 so that the upper surface 26 is not exposed. In particular, the upper surface 26 of the ESC 22 is fully covered during plasma processing. In some embodiments, the cover may comprise one or more auxiliary cover members (not shown) to ensure the upper surface 26 of the ESC 22 is fully covered during plasma processing.

Figure 5:
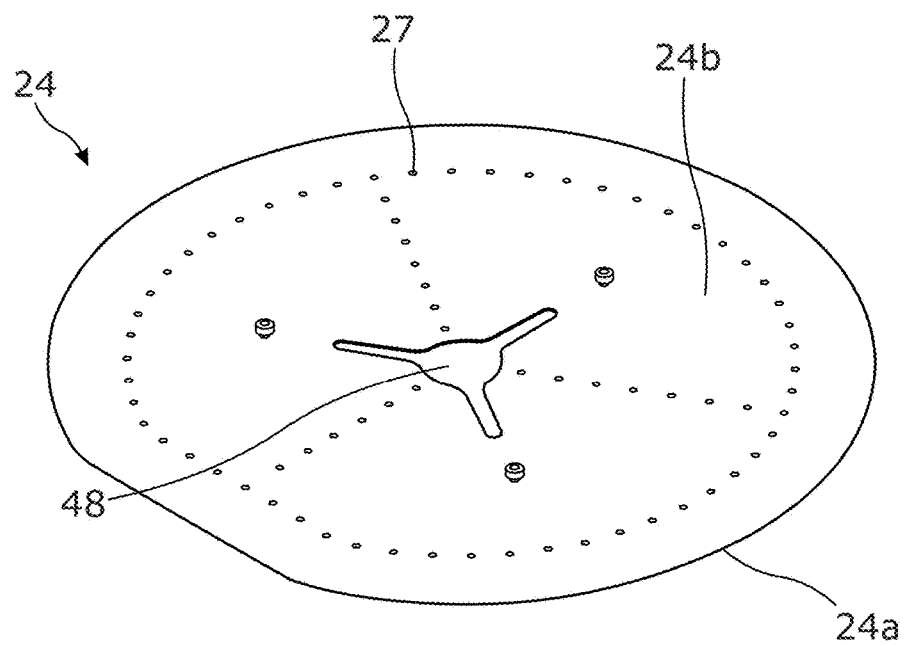
FIG. 5 is a perspective view of a cover according to the first embodiment.

The cover 24 (shown in more detail in FIG. 5) has a first face 24a adjacent to the upper surface 26 of the ESC 22. The first face 24a typically contacts the upper surface 26 across the full area of the upper surface 26. This provides a good thermal contact between the upper surface 26 and the cover 24, and allows efficient heat exchange between the ESC 22 and the cover 24. The cover 24 has a second face 24b which faces away from the ESC 22. The second face 24b is oriented upwardly in order to support a substrate 28. Typically, the substrate 28 rests on the second face 24b of the cover 24. The substrate 28 is typically a semiconductor substrate, such as a silicon wafer. FIG. 3 illustrates the position of the substrate 28 on the cover 24.

The cover 24 further comprises one or more apertures or conduits 27 that extend through the cover 24. More specifically, the conduits 27 extend from the first face 24a to the second face 24b to permit a cooling gas to be flowed therethrough.

In the first embodiment, the cover 24 has a larger diameter than the substrate 28. That is, the substrate 28 does not overhang the circumference of the cover 24. The cover 24 comprises a substrate support region 30 that supports the substrate 28. The substrate 28 overlays and covers the substrate support region 30. The cover 24 further comprises a peripheral region 32 that extends outwardly from the substrate support region 30. In the first embodiment, the substrate support region 30 and the peripheral region 32 are coplanar. The peripheral region 32 is not covered by substrate 28 and typically remains uncovered during plasma processing. In some embodiments, an additional annular focus ring 50 may overlay the outer periphery of the cover 24 (e.g. the outer periphery of the peripheral region 32).

The present inventors have found that a cover 24 that extends beyond the diameter of the wafer 28 surprisingly helps to prevent, or at least reduce, the accumulation of particulate deposits, such as polymer deposits, on the substrate support 20. Without wishing to be bound by any theory or conjecture, it is believed that ion bombardment of the exposed regions of the cover 24 during plasma processing removes particulate deposits from the upwardly facing surface 24b. Therefore, a cover 24 that has a larger diameter than the substrate 28 helps to reduce the formation of unwanted deposits.

The conduits 27 are located in the substrate support region 30 so that a cooling gas can be applied to a backside of the substrate 28. The cooling gas transfers heat away from the substrate and provides an efficient method to cool the substrate 28. The cooling gas is typically helium, although other coolants known in the art may be used.

The ESC 22 and/or platen 25 typically comprise one or more cooling channels supplied by cooling connections 36. The cooling channels flow the cooling gas through the ESC to the first face of the cover 24a that is adjacent to the upper surface 26. A layer of cooling gas typically exists between the upper surface 26 of the ESC and the first face of the cover 24a when a gas is supplied. This provides efficient cooling between the ESC 22 and the cover 24. Additionally, the cooling gas flows through the conduits 27 to form a cooling gas layer between the substrate 28 and the upward face of the cover 24b. This allows efficient heat exchange to occur between the substrate 28 and the cooled ESC 22 through the cover 24. The cooling gas layers help to facilitate the heat exchange between the substrate 28 and the ESC 22.

The ESC 22 typically comprises one or more metal electrodes 34 embedded between upper and lower dielectric plates 22a, 22b. In some embodiments, the metal electrodes are DC electrodes that are supplied by a DC bias. The DC bias typically generates an electrostatic clamping force. In some embodiments, the metal electrodes are RF electrodes that are supplied by an RF bias. An RF bias can capacitively couple to the substrate being processed. The diameter of the one or more electrodes defines a clamping region. In the first embodiment, the clamping region extends beyond the substrate support region 30 and hence beyond the diameter of the substrate 28. This beneficially provides an extended area (i.e. beyond the diameter of the substrate 28) through which the substrate is capacitively coupled by the RF electrodes. The upper surface 26 further comprises an edge region which extends outwardly of the clamping region.

The substrate support 20 further comprises a lifting assembly 42. The lifting assembly 42 is configured to lift the substrate 28 from the substrate support 20 whilst keeping the cover 24 in position on the ESC 22. In the first embodiment, the lifting assembly 42 comprises a central lift pin 44 with three arms 46 extending outwardly therefrom. Additional lift pins may be provided in some embodiments to help stabilise the substrate 28 when being lifted. The cover 24 comprises a complementary aperture 48 to allow the three arms 46 to pass through the cover 24 so that the substrate 28 can be lifted independently of the cover 24.

In operation, the ESC 22 provides an electrostatic clamping force that clamps the substrate 28 in position. That is, there is a Coulombic attraction between the substrate 28 and the ESC 22. Typically, the cover 24 is not electrostatically or mechanically clamped to the ESC 22 directly. The cover 24 is fixed in position by virtue of the electrostatic clamping force between the substrate 28 and the ESC 22. The extent of electrostatic coupling experienced by the substrate 28 is dependent upon the material and thickness of the cover 24. The cover is typically made from a dielectric or ceramic material, such as $Al_2O_3$ or AlN. Such dielectric materials provide good thermal conductivity while maintaining sufficient electrostatic coupling between the substrate 28 and the ESC 22. The thickness of the cover 24 is typically optimised to provide desired conditions. The thickness of the cover 24 is typically a similar thickness to the upper dielectric plate 22a of the ESC.

A thicker cover 24 causes the electrostatic coupling between the ESC 22 and the substrate 28 to be reduced. Therefore, the electrostatic clamping force between the substrate 28 and the ESC 22 is weaker, and the "blow off" pressure required to dislodge or lift the substrate 28 is reduced. The "blow off" pressure is the backside pressure required to dislodge or lift the substrate from the support. On the other hand, a thicker cover 24 increases the usable lifetime of the cover 24, and therefore reduces the frequency of replacement for the cover 24.

In contrast, a thinner cover 24 exhibits greater electrostatic coupling between the ESC 22 and the substrate 28, and exhibits a higher "blow off" pressure. However, a thinner cover 24 has a shorter usable lifetime before needing replacement. The cover typically has a thickness of 100-1500 µm, and preferably of 300-1000 µm.

Figure 6:
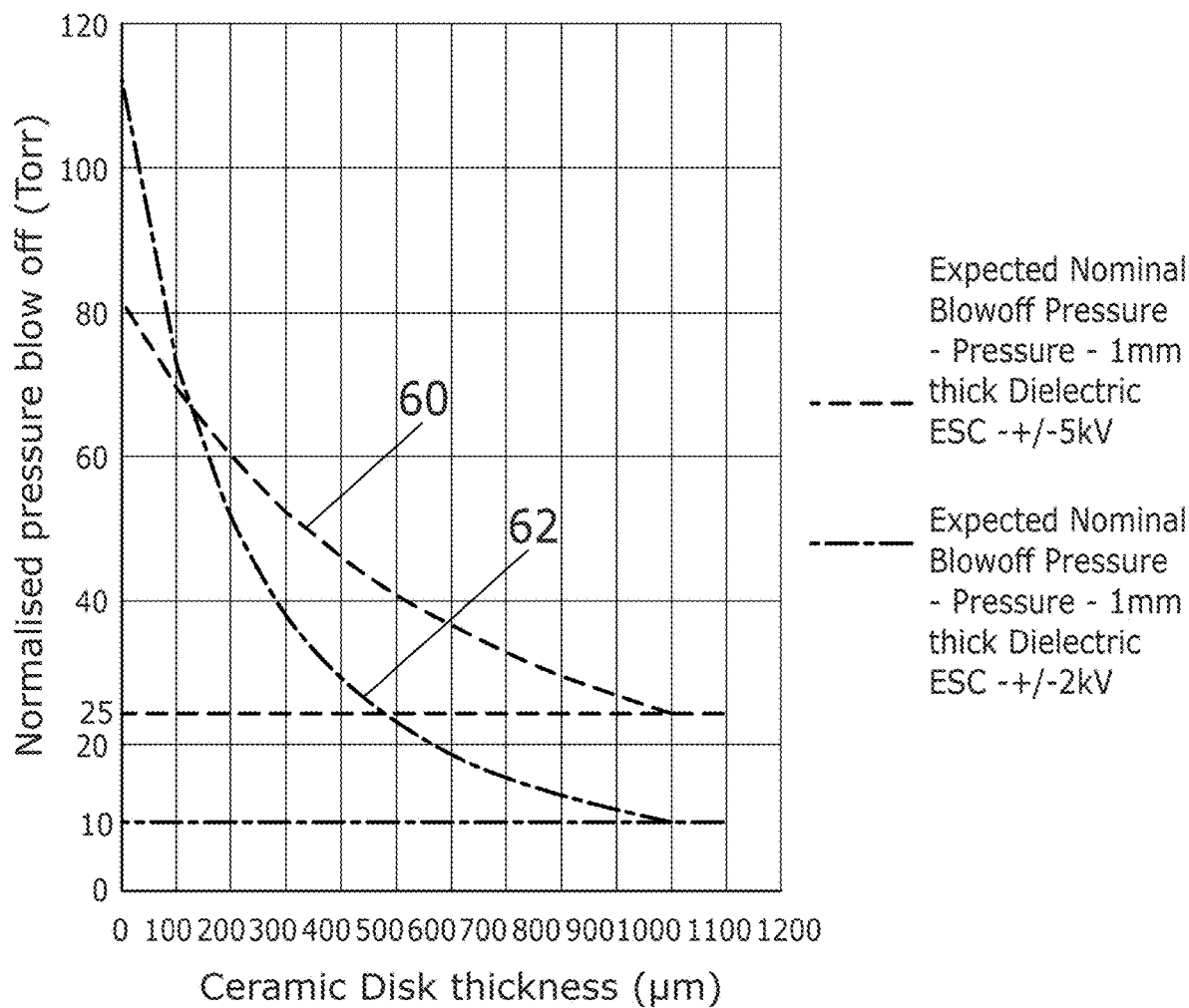
FIG. 6 is a chart showing the normalised blow-off pressure for a cover of the first embodiment.

FIG. 6 shows a plot of how the predicted "blow off" pressure (in Torr) varies with the thickness of the cover 24 (in µm) when the ESC is supplied with 5 kV (line 60) and 2 kV (line 62). The thickness of the upper dielectric 22a is in this example is 1 mm. Typically, the "blow off" pressure is preferably at least 10 Torr, and more preferably at least 25 Torr. A higher blow off pressure enables a higher pressure of cooling gas to be applied to the backside of the substrate 28 before it is dislodged from the substrate support 20. A higher backside pressure of cooling gas can assist in heat transfer between the substrate 28 and the ESC 22. The cover 24 provides a thermally conductive pathway between the substrate 28 and the ESC 22, both through the conduits 27 and through the dielectric material of the cover 24.

Although not limited in this regard, the substrate support 20 of the first embodiment has particular uses in plasma processing apparatus, such as in plasma etching and deposition apparatus. An annular focus ring 50 may be disposed around the substrate support 20 to control the uniformity of the plasma and to control the direction of ions in the plasma. In plasma processing, the exposed peripheral region 32 of the cover 24 is not protected from the plasma conditions and may erode over time. Since the cover 24 has a larger diameter than the substrate 28 being supported (i.e. there is no overhang), the formation of particulate deposits is avoided, or at least reduced. Additionally, the cover 24 protects the upper surface 26 of the ESC 22 from exposure to the plasma processing conditions, therefore preventing erosion of the ESC 22. This increases the usable lifetime of the ESC 22.

What is claimed is:

1. A substrate support comprising:
an electrostatic chuck comprising an upper surface, wherein the upper surface of the electrostatic chuck comprises a clamping region for providing an electrostatic clamping force;
a cover that is a single piece and is positioned on the electrostatic chuck to cover the upper surface thereof, the cover comprising a first face adjacent the upper surface of the electrostatic chuck, a second face for supporting a substrate, and one or more conduits extending through the cover to permit a cooling gas to flow from the first face to the second face, wherein the second face comprises a substrate support region and a peripheral region radially outward of the substrate support region, wherein the substrate support region has a diameter smaller than that of the clamping region, and wherein the second face in the substrate support region and the second face in the peripheral region are coplanar; and
a lifting assembly which in use is operable to separate a substrate from the cover;
wherein the cover and an upper face of the electrostatic chuck are made from a same dielectric material, wherein the cover is replaceable by virtue of not being attached to the electrostatic chuck other than through electrostatic clamping of the substrate caused by the operation of the electrostatic chuck, and wherein the cover and the electrostatic chuck each have a diameter, and the diameter of the cover is larger than the diameter of the electrostatic chuck.

2. The support according to claim 1, in which the cover has a thickness of 100-1500 μm.

3. The support according to claim 1, in which the cover is a disc or disc-like.

4. The support according to claim 1 in which, when a substrate is being supported, the substrate overlays the substrate support region.

5. The support according to claim 1 in which the one or more conduits are only disposed in the substrate support region.

6. The support according to claim 1 in which the upper surface of the electrostatic chuck comprises an edge region extending radially outwardly of the clamping region.

7. The support according to claim 1 in which the cover is made from $Al_2O_3$ or AlN.

8. The substrate support according to claim 1 in which the electrostatic chuck further comprises one or more cooling channels for providing the cooling gas to the first face of the cover.

9. The substrate support according to claim 1 in which the electrostatic chuck further comprises at least one DC electrode supplied by a DC power supply.

10. The substrate support according to claim 1 in which the electrostatic chuck further comprises at least one RF electrode supplied by an RF power supply.

11. The substrate support according to claim 1 in which the lifting assembly comprises one or more lifting members, wherein the lifting assembly is operable to move the lifting members through corresponding apertures in the cover to separate the substrate from the cover.

12. A plasma processing apparatus comprising:
a chamber; and
the substrate support according to claim 1 disposed within the chamber.

13. The support according to claim 2, in which the thickness is 300-1000 μm.

14. The support according to claim 2, in which the thickness is from 100 μm to less than 500 μm.

15. The support according to claim 1, further comprising an annular focus ring at an outer periphery of the upper surface, wherein the annular focus ring defines part of an upper surface at a height different from the upper surface of the electrostatic chuck and the second face of the cover, and wherein the annular focus ring is disposed on the second face of the cover.

16. The support according to claim 1, wherein the lifting assembly is in a center of the electrostatic chuck and is configured to extend through part of the substrate support region.

17. The support according to claim 8, wherein a pressure of the cooling gas provided by the one or more cooling channels is at least 10 Torr.

18. The support according to claim 17, wherein the pressure is at least 25 Torr.

* * * * *